US006495479B1

(12) United States Patent
Wu et al.

(10) Patent No.: US 6,495,479 B1
(45) Date of Patent: Dec. 17, 2002

(54) SIMPLIFIED METHOD TO PRODUCE NANOPOROUS SILICON-BASED FILMS

(75) Inventors: Hui-Jung Wu, Fremont, CA (US); James S Drage, Fremont, CA (US); Lisa Brungardt, Albuquerque, NM (US); Teresa A. Ramos, Albuquerque, NM (US); Douglas M. Smith, Albuquerque, NM (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 09/566,287

(22) Filed: May 5, 2000

(51) Int. Cl.[7] ............................................. H01L 21/469
(52) U.S. Cl. ...................... 438/781; 438/409; 438/778; 438/780; 438/782; 438/960
(58) Field of Search ................................ 438/409, 623, 438/778, 780, 781, 782, 787, 790, 960

(56) References Cited

U.S. PATENT DOCUMENTS

| | | | |
|---|---|---|---|
| 5,726,211 A | | 3/1998 | Hedrick et al. ............... 521/61 |
| 5,731,395 A | * | 3/1998 | Tsuno ........................... 526/334 |
| 5,753,305 A | | 5/1998 | Smith et al. ................... 427/335 |
| 5,767,014 A | | 6/1998 | Hawker et al. ................ 438/623 |
| 5,773,197 A | | 6/1998 | Carter et al. .................. 430/313 |
| 5,804,607 A | | 9/1998 | Hedrick et al. ............... 521/64 |
| 5,883,219 A | | 3/1999 | Carter et al. .................. 528/310 |
| 5,895,263 A | | 4/1999 | Carter et al. .................. 438/624 |
| 5,922,299 A | | 7/1999 | Bruinsina et al. ............. 423/335 |
| 6,093,636 A | * | 7/2000 | Carter et al. .................. 438/623 |
| 6,107,357 A | * | 8/2000 | Hawker et al. ................ 521/77 |
| 6,271,278 B1 | * | 8/2001 | Park et al. ..................... 521/150 |
| 6,318,124 B1 | * | 11/2001 | Rutherford et al. .......... 65/60.8 |

FOREIGN PATENT DOCUMENTS

| | | |
|---|---|---|
| EP | 0 775 669 | 5/1997 |
| EP | 0 881 678 | 12/1998 |
| WO | WO 98/46526 | 10/1998 |
| WO | WO 98/47177 | 10/1998 |
| WO | WO 00/13222 | 3/2000 |

OTHER PUBLICATIONS

J.W. Labadie et al. "Nanopore foams of high–temperature polymers", 1992, IEEE, pp. 688–691.*
Sharp, Kenneth G. "A Two Component, Non–Aqueous Route to Silica Gel", Journal of Sol–Gel Science and Technology; 2, p. 35–41 (1994).
Miller, R.D., et al "Porour Organosilicates for On–Chip Dielectric Applications"; Mat. Res. Soc.Symp. Proc. vol. 565 (1999), p3–15.
Liu, et al "Preparation of Continuous Mesoporous Films on Porous and Dense Substrates"; Mat. Res. Soc.Symp. Proc. vol. 431 (1996); p. 245–249.
Bruinsma, P.J., et al "Low K Mesoporous Films Through Template Based Processing"; Mat. Res. Soc.Symp. Proc. vol. 443 (1997), p. 105–111.

(List continued on next page.)

Primary Examiner—Carl Whitehead, Jr.
Assistant Examiner—Maria Guerrero
(74) Attorney, Agent, or Firm—Roberts & Mercanti, LLP

(57) ABSTRACT

A nanoporous dielectric film useful for the production of semiconductor devices, integrated circuits and the like, is provided, together with processes for producing these improved films. The films are produced by a process that includes (a) preparing a silicon-based, precursor composition including a porogen, (b) coating a substrate with the silicon-based precursor to form a film, (c) aging or condensing the film in the presence of water, (d) heating the gelled film at a temperature and for a duration effective to remove substantially all of said porogen, and wherein the applied precursor composition is substantially aged or condensed in the presence of water in liquid or vapor form, without the application of external heat or exposure to external catalyst.

36 Claims, 1 Drawing Sheet

OTHER PUBLICATIONS

Ogawa, Makoto, et al Preparation of Self–Standing Transparent Films of Silica–Surfactant Mesostructured Materials and the Conversion to Porous Films; Advanced Materials; 10 No. 14; (1998) p 1077–81.

Hawker, Craig J. Supramolecular Approaches to Nanoscale Dielectric Foams for Advanced Microelectronic Devices; MRS Bulletin, Apr. 2000; P 54–58.

Baskaran, S., et al Low K Mesoporous Silica Films: Synthesis, Pore Structure and Properties; Sematech Low k Dielectric Workshop; Mar. 1999.

U.S. patent application Ser. No. 09/291,510, Roger Yu-Kwan Leung et al., filed Apr. 14, 1999.

U.S. patent application Ser. No. 09/291,511, Roger Yu-Kwan Leung et al., filed Apr. 14, 1999.

* cited by examiner

SIMPLIFIED METHOD TO PRODUCE NANOPOROUS SILICON-BASED FILMS

FIELD OF THE INVENTION

The present invention relates to novel nanoporous silica dielectric films having improved mechanical strength, and to semiconductor devices comprising these improved films. The present invention also provides improved processes for producing the same on substrates suitable for use in the production of semiconductor devices, such as integrated circuits. The nanoporous films of the invention are prepared using silicon-based starting materials and polymers, copolymers, oligomers, and/or compounds, and are prepared by a simplified process that, in one embodiment, allows for aging or gelation without heating.

BACKGROUND OF THE INVENTION

As feature sizes in integrated circuits approach 0.25 μm and below, problems with interconnect RC delay, power consumption and signal cross-talk have become increasingly difficult to resolve. It is believed that the integration of low dielectric constant materials for interlevel dielectric (ILD) and intermetal dielectric (IMD) applications will help to solve these problems. While there have been previous efforts to apply low dielectric constant materials to integrated circuits, there remains a longstanding need in the art for further improvements in processing methods and in the optimization of both the dielectric and mechanical properties of such materials used in the manufacture of integrated circuits.

Nanoporous Films

One material with a low dielectric constant are nanoporous films prepared from silica, i.e., silicon-based materials. Air has a dielectric constant of 1, and when air is introduced into a suitable silica material having a nanometer-scale pore structure, such films can be prepared with relatively low dielectric constants ("k"). Nanoporous silica materials are attractive because similar precursors, including organic-substituted silanes, e.g., tetraethoxysilane ("TEOS"), are used for the currently employed spin-on-glasses ("S.O.G.") and chemical vapor deposition ("CVD") of silica $SiO_2$. Nanoporous silica materials are also attractive because it is possible to control the pore size, and hence the density, mechanical strength and dielectric constant of the resulting film material. In addition to a low k, nanoporous films offer other advantages including: 1) thermal stability to 900° C., 2) substantially small pore size, i.e., at least an order of magnitude smaller in scale than the microelectronic features of the integrated circuit, 3) as noted above, preparation from materials such as silica and TEOS that are widely used in semiconductors, 4) the ability to "tune" the dielectric constant of nanoporous silica over a wide range, and 5) deposition of a nanoporous film can be achieved using tools similar to those employed for conventional S.O.G. processing.

Thus, high porosity in silica materials leads to a lower dielectric constant than would otherwise be available from the same materials in nonporous form. An additional advantage, is that additional compositions and processes may be employed to produce nanoporous films while varying the relative density of the material. Other materials requirements include the need to have all pores substantially smaller than circuit feature sizes, the need to manage the strength decrease associated with porosity, and the role of surface chemistry on dielectric constant and environmental stability.

Density (or the inverse, porosity) is the key parameter of nanoporous films that controls the dielectric constant of the material, and this property is readily varied over a continuous spectrum from the extremes of an air gap at a porosity of 100% to a dense silica with a porosity of 0%. As density increases, dielectric constant and mechanical strength increase but the degree of porosity decreases, and vice versa. This suggests that the density range of nanoporous films must be optimally balanced between the desired range of low dielectric constant and the mechanical properties acceptable for the desired application.

Nanoporous silica films have previously been fabricated by a number of methods. For example, nanoporous films have been prepared using a mixture of a solvent and a silica precursor, which is deposited on a substrate suitable for the purpose. Broadly, a precursor in the form of, e.g., a spin-on-glass composition is applied to a substrate, and then polymerized in such a way as to form a dielectric film comprising nanometer-scale voids.

When forming such nanoporous films, e.g., by spin-coating, the film coating is typically catalyzed with an acid or base catalyst and water to cause polymerization/gelation ("aging") during an initial heating step.

More recently, U.S. Pat. No. 5,895,263 describes forming a nanoporous silica dielectric film on a substrate, e.g., a wafer, by applying a composition comprising decomposable polymer and organic polysilica i.e., including condensed or polymerized silicon polymer, heating the composition to further condense the polysilica, and decomposing the decomposable polymer to form a porous dielectric layer. This process, like many of the previously employed methods of forming nanoporous films on semiconductors, has the disadvantage of requiring heating for both the aging or condensing process, and for the removal of a polymer to form the nanoporous film. Furthermore, there is a disadvantage that organic polysilica, contained in a precursor solution, tends to increase in molecular weight after the solution is prepared; consequently, the viscosity of such precursor solutions increases during storage, and the thickness of films made from stored solutions will increase as the age of the solution increases. The instability of organic polysilica thus requires short shelf life, cold storage, and fine tuning of the coating parameters to achieve consistent film properties in a microelectronics/integrated circuit manufacturing process.

As mentioned supra, there is a continuing need in the microelectronics industry to provide improved materials allowing for semiconductor devices, such as integrated circuits, with increased circuit density, and increased processing speed and power. This is coupled with a continuing desire to reduce the cost in time, money and manufacturing equipment of producing such semiconductor devices. Thus, there remains this ongoing need for further improvements in both the desirable properties of nanoporous dielectric films, as well as an ongoing need for further improvements in methods for producing such nanoporous dielectric films.

SUMMARY OF THE INVENTION

In order to solve the above mentioned problems and to provide other improvements, the invention provides novel nanoporous silica dielectric films with a low dielectric constant ("k"), e.g., typically ranging from about 1.5 to about 3.8, as well as novel new methods of producing these dielectric films.

Broadly, the dielectric nanoporous films of the invention are prepared by a method that includes the following process steps:

(a) preparing a silicon-based, precursor composition including a porogen, (b) coating a substrate with the silicon-based precursor to form a film, (c) aging or condensing the film in the presence of water, (d) heating the gelled film at a temperature and for a duration effective to remove substantially all of the porogen.

Advantageously, in the above-described process steps, the precursor composition is substantially aged or condensed in the presence of water in liquid or vapor form, without the application of external heat or exposure to external catalyst.

The artisan will appreciate that the molar ratio of water to Si can be readily determined by the desired rate of condensation and the successful production of nanoporous silica dielectric films. In particular embodiments, the molar ratio of water to Si ranges, e.g., from about 2:1 to about 0:1.

Broadly, the silicon-based precursor composition includes a monomer or prepolymer according to Formula I:

$$Rx—Si—Ly \qquad \text{(Formula I)}$$

wherein x is an integer ranging from 0 to about 2, and y is an integer ranging from about 2 to about 4;

R is independently selected from the group consisting of alkyl, aryl, hydrogen and combinations thereof;

L is an electronegative moiety, such as, e.g., alkoxy, carboxy, amino, amido, halide, isocyanato and combinations thereof The silicon-based precursor composition optionally includes one or more monomers or prepolymers of Formula I, as well as a polymer formed from the condensation of one or more different monomers or prepolymers according to Formula I. The polymer formed from Formula I has a molecular weight, for example, that ranges from about 150 to about 10,000 amu.

Useful monomers or prepolymers include, e.g., acetoxysilane, an ethoxysilane, a methoxysilane, and combinations thereof Particular monomers or prepolymers useful according to the invention also include, e.g., tetraacetoxysilane, a $C_1$ to about $C_6$ alkyl or aryl-triacetoxysilane, and combinations thereof. The triacetoxysilane is, for example, a methyltriacetoxysilane. Further monomers or prepolymers useful according to the invention also include, e.g., tetrakis(2,2,2-trifluoroethoxy)silane, tetrakis(trifluoroacetoxy)silane, tetraisocyanatosilane, tris(2,2,2-trifluoroethoxy)methylsilane, tris(trifluoroacetoxy)methylsilane, methyltriisocyanatosilane and combinations thereof.

Optionally, the water employed for the processes of the invention is added to the silicon-based, precursor composition prior to the application of the precursor composition to the substrate. Variations on this process include the addition of amounts of water to the silicon-based, precursor composition insufficient to fully condense or age the applied film, and completing the aging process by exposing the applied film to environmental water vapor. In one particularly convenient embodiment of the invention, no water is added to the silicon-based, precursor composition prior to application to the substrate. Instead, all of the water for aging the film is provided by environmental, e.g., atmospheric water vapor present in the controlled atmosphere of the processing facility. The atmospheric partial pressure of water vapor in the processing facility can be adjusted to range, for example, from about 5 mm Hg to about 20 mm Hg, The time required for achieving water-mediated aging depends on the materials selected, on the source of the water, e.g., mixed into the precursor or from environmental water vapor, and the desired degree of aging. The time period ranges, for example, from about 20 seconds to about 5 minutes, or more.

A useful porogen according to the invention is added to the precursor in an amount ranging from about 2 to about 20 weight percent. The porogen also has a boiling point, sublimation point or decomposition temperature ranging, e.g., from about 175° C. to about 450° C. The porogen also has a molecular weight ranging, e.g., from about 100 to about 10,000 amu, or more particularly, from about 100 to about 3,000 amu. In addition, the porogen is selected to be readily removed from the applied and aged film, e.g., by heating at a temperature ranging from about 175° C. to about 300° C., for a time period ranging from about 30 seconds to about 5 minutes to remove substantially all of the porogen.

A solvent is also optionally provided to reduce precursor viscosity and aid film spreading, as required. When a solvent is present, the silicon-based, precursor composition includes a solvent or mixture of solvents in an amount ranging, for example, from about 10% to about 90% by weight. The solvent has a boiling point ranging, for instance, from about 50 to about 175° C. and is selected, for example, from hydrocarbons, esters, ethers, ketones, alcohols, amides and combinations thereof. However, to avoid undesirable interactions, the solvent is not an alcohol when the silicon based monomer or precursor comprises an acetoxy-functional group. To avoid cross-linkage of the solvent to the precursor, it should be noted that the solvent optionally does not include hydroxyl or amino groups. Nanoporous dielectric films prepared by the methods of the invention, as well as semiconductor devices and/or integrated circuits manufactured with such films, are also provided.

DETAILED DESCRIPTION OF THE PREFERRED EMBODIMENT

Figure 1:
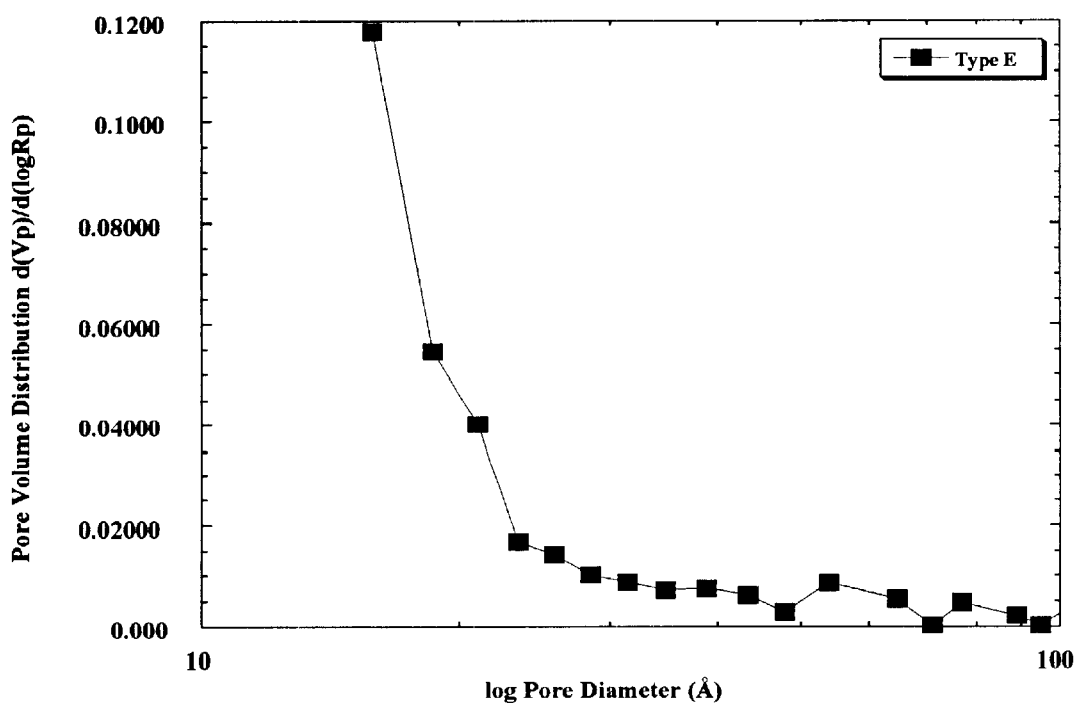
FIG. 1 Illustrates the pore volume distribution (Y-axis) platted against the log of the pore size (X-axis).

Accordingly, nanoporous silica dielectric films having a dielectric constant, or k value, ranging from about 1.5 to about 3.8, can be produced by the methods of the invention. Typically, silicon-based dielectric films, including nanoporous silica dielectric films, are prepared from a suitable silicon-based dielectric precursor composition, e.g., a spin-on-glass ("S.O.G.") material blended with one or more optional solvents and/or other components. The dielectric precursor composition is applied to a substrate suitable, e.g., for production of a semiconductor device, such as an integrated circuit ("IC"), by any art-known method.

The films produced by the processes of the invention have a number of advantages over those previously known to the art, including improved mechanical strength, that enables the produced film to withstand the further processing steps required to prepare a semiconductor device on the treated substrate, and a low and stable dielectric constant. The property of a stable dielectric constant is advantageously achieved without the need for further surface modification steps to render the film surface hydrophobic, as was formerly required by a number of processes for forming nanoporous silica dielectric films. Instead, the silica dielectric films as produced by the processes of the invention are sufficiently hydrophobic as initially formed.

Further, in one embodiment, the processes of the invention advantageously require no heating step or steps for the initial polymerization (i.e., gelling or aging) of an applied precursor composition onto a substrate. Instead, the precusor composition is selected to be water-polymerizable, and water is either blended with the precursor prior to application to the desired substrate, and/or after application to a substrate, atmospheric moisture facilitates the aging process, in situ. Further still, the processes of the invention provided for a nanometer scale (10 nm or less) diameter pore size, which is also uniform in size distribution.

In order to better appreciate the scope of the invention, it should be understood that unless the "$SiO_2$" functional group is specifically mentioned when the term "silica" is employed, the term "silica" as used herein, for example, with reference to nanoporous dielectric films, is intended to refer to dielectric films prepared by the inventive methods from an organic or inorganic glass base material, e.g., any suitable silicon-based material. It should also be understood that the use of singular terms herein is not intended to be so limited, but, where appropriate, also encompasses the plural, e.g., exemplary processes of the invention may be described as applying to and producing a "film" but it is intended that multiple films can be produced by the described, exemplified and claimed processes, as desired.

Additionally, the term "aging" refers to gelling, condensing, or polymerization, of the combined silica-based precursor composition on the substrate after deposition, induced, e.g., by exposure to water and/or an acid or base catalyst. The term "curing" refers to the removal of residual silanol (Si—OH) groups, removal of residual water, and the process of making the film more stable during subsequent processes of the microelectronic manufacturing process. The curing process is performed after gelling, typically by the application of heat, although any other art-known form of curing may be employed, e.g., by the application of energy in the form of an electron beam, ultraviolet radiation, and the like. The terms, "agent" or "agents" herein should be considered to be synonymous with the terms, "reagent" or "reagents," unless otherwise indicated.

Dielectric films, e.g., interlevel dielectric coatings, are prepared from suitable precursors applied to a substrate. Art-known methods for applying the dielectric precursor composition, include, but are not limited to, spin-coating, dip coating, brushing, rolling, spraying and/or by chemical vapor deposition. Prior to application of the base materials to form the dielectric film, the substrate surface is optionally prepared for coating by standard, art-known cleaning methods. The coating is then processed to achieve the desired type and consistency of dielectric coating, wherein the processing steps are selected to be appropriate for the selected precursor and the desired final product. Further details of the inventive methods and compositions are provided below.

Substrates

Broadly speaking, a "substrate" as described herein includes any suitable composition formed before a nanoporous silica film of the invention is applied to and/or formed on that composition. For example, a substrate is typically a silicon wafer suitable for producing an integrated circuit, and the base material from which the nanoporous silica film is formed is applied onto the substrate by conventional methods, e.g., including, but not limited to, the art-known methods of spin-coating, dip coating, brushing, rolling, and/or spraying. Prior to application of the base materials to form the nanoporous silica film, the substrate surface is optionally prepared for coating by standard, art-known cleaning methods.

Suitable substrates for the present invention non-exclusively include semiconductor materials such as gallium arsenide ("GaAs"), silicon and compositions containing silicon such as crystalline silicon, polysilicon, amorphous silicon, epitaxial silicon, and silicon dioxide ("$SiO_2$") and mixtures thereof. On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer. Other optional features of the surface of a suitable substrate include an oxide layer, such as an oxide layer formed by heating a silicon wafer in air, or more preferably, an $SiO_2$ oxide layer formed by chemical vapor deposition of such art-recognized materials as, e.g., plasma enhanced tetraethoxysilane oxide ("PETEOS"), plasma enhanced silane oxide ("PE silane") and combinations thereof, as well as one or more previously formed nanoporous silica dielectric films.

The nanoporous silica film of the invention can be applied so as to cover and/or lie between such optional electronic surface features, e.g., circuit elements and/or conduction pathways that may have been previously formed features of the substrate. Such optional substrate features can also be applied above the nanoporous silica film of the invention in at least one additional layer, so that the low dielectric film serves to insulate one or more, or a plurality of electrically and/or electronically functional layers of the resulting integrated circuit. Thus, a substrate according to the invention optionally includes a silicon material that is formed over or adjacent to a nanoporous silica film of the invention, during the manufacture of a multilayer and/or multicomponent integrated circuit.

In a further option, a substrate bearing a nanoporous silica film or films according to the invention can be further covered with any art known non-porous insulation layer, e.g., a glass cap layer.

Water Condensable Precursor Compositions

Broadly, the precursor composition employed for forming silica-dielectric films according to the invention includes one or more silicon-based monomers and/or polymers that are readily condensed in the presence of water. The water can be optionally supplied during preparation of the liquid precursor composition, absorbed from environmental water vapor, and/or combinations of these.

For a silicon based monomer or pre-polymer to be reactive with water, the monomer or prepolymer must have at least two reactive groups that can be hydrolyzed. Such reactive groups include, e.g., alkoxy (RO), acetoxy (AcO), etc. Without meaning to be bound by any theory or hypothesis as to how the methods and compositions of the invention are achieved, it is believed that water hydrolyzes the reactive groups on the silicon monomers to form Si—OH groups (silanols). The latter will undergo condensation reactions with other silanols or with other reactive groups, as illustrated by the following formulas:

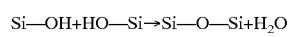

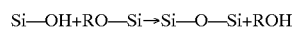

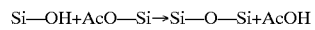

R=alkyl or aryl

Ac=acyl ($CH_3CO$)

These condensation reactions lead to formation of silicon based polymers. Generally speaking, an acid or base is used to catalyze both the hydrolysis and the condensation reactions. It should be mentioned that when adding volatile acid or base catalysts to the precursor composition there is the potential that some or all of the catalyst will evaporate during deposition of the precursor onto the substrate. While such evaporative losses can be controlled or compensated for, certain embodiments of the present invention advantageously avoid this difficulty by forming an acid catalyst in situ by reaction with water. In particular, the reaction of water with acetoxy groups produces acetic acid; the latter compound is a catalyst for hydrolysis and condensation reactions. Therefore, when using acetoxy and other precursors of this type, it is not necessary to add catalyst to the precursor composition;

Thus, in one embodiment of the invention, the dielectric precursor composition includes a compound, or any combination of compounds, denoted by Formula I:

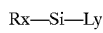    (Formula I)

wherein x is an integer ranging from 0 to about 2 and y is an integer ranging from about 2 to about 4), R is independently alkyl, aryl, hydrogen and/or combinations of these, L is independently selected and is an electronegative group, e.g., alkoxy, carboxy, halide, isocyanato and/or combinations of these.

Particularly useful monomers or precursors are those provided by Formula I when x ranges from about 0 to about 2, y ranges from about 2 to about 4, R is alkyl or aryl or H, and L is an electronegative group, and wherein the rate of hydrolysis of the Si—L bond is greater than the rate of hydrolysis of the Si—OCH$_2$CH$_3$ bond. Thus, for the following reactions designated as (a) and (b):

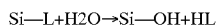 a)

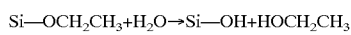 b)

The rate of (a) is greater than rate of (b).

Examples of suitable compounds according to Formula I include, but are not limited to:

| | |
|---|---|
| Si(OCH2CF$_3$)$_4$ | tetrakis(2,2,2-trifluoroethoxy)silane, |
| Si(OCOCF$_3$)$_4$ | tetrakis(trifluoroacetoxy)silane*, |
| Si(OCN)$_4$ | tetraisocyanatosilane, |
| CH$_3$Si(OCH2CF$_3$)$_3$ | tris(2,2,2-trifluoroethoxy)methylsilane, |
| CH$_3$Si(OCOCF$_3$)$_3$ | tris(trifluoroacetoxy)methylsilane*, |
| CH$_3$Si(OCN)$_3$ | methyltriisocyanatosilane, |

[*These generate acid catalyst upon exposure to water]

and or combinations of any of the above.

In another embodiment of the invention, the dielectric precursor composition includes a polymer synthesized from compounds denoted by Formula I by way of hydrolysis and condensation reactions, wherein the number average molecular weight ranges from about 150 to about 10,000 amu.

In a further embodiment of the invention, silicon-based dielectric precursors useful according to the invention include organosilanes, including, for example, alkoxysilanes according to Formula II, as taught, e.g., by co-owned U.S. Ser. No. 09/054,262, filed on Apr. 3, 1998, the disclosure of which is incorporated by reference herein in its entirety.

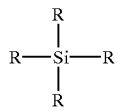

Formula II

Optionally, Formula II is an alkoxysilane wherein at least 2 of the R groups are independently $C_1$ to $C_4$ alkoxy groups, and the balance, if any, are independently selected from the group consisting of hydrogen, alkyl, phenyl, halogen, substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

In a further option, for instance, especially when the precursor is applied to the substrate by chemical vapor deposition, e.g., as taught by co-owned patent application Ser. No. 09/111,083, filed on Jul. 7, 1998, and incorporated by reference herein in its entirety, the precursor can also be an alkylalkoxysilane as described by Formula II, but instead, at least 2 of the R groups are independently $C_1$ to $C_4$ alkylalkoxy groups wherein the alkyl moiety is $C_1$ to $C_4$ alkyl and the alkoxy moiety is $C_1$ to $C_6$ alkoxy, or ether-alkoxy groups; and the balance, if any, are independently selected from the group consisting of hydrogen, alkyl, phenyl, halogen, substituted phenyl. In one preferred embodiment each R is methoxy, ethoxy or propoxy. In another preferred embodiment at least two R groups are alkylalkoxy groups wherein the alkyl moiety is $C_1$ to $C_4$ alkyl and the alkoxy moiety is $C_1$ to $C_6$ alkoxy. In yet another preferred embodiment for a vapor phase precursor, at least two R groups are ether-alkoxy groups of the formula $(C_1$ to $C_6$ alkoxy$)_n$ wherein n is 2 to 6.

Application Ser. No. 09/111,083, mentioned above, also teaches that preferred silica precursors for chemical vapor deposition include, for example, any or a combination of alkoxysilanes such as tetraethoxysilane, tetrapropoxysilane, tetraisopropoxysilane, tetra(methoxyethoxy)silane, tetra(methoxyethoxyethoxy)silane which have four groups which may be hydrolyzed and than condensed to produce silica, alkylalkoxysilanes such as methyltriethoxysilane silane, arylalkoxysilanes such as phenyltriethoxysilane and precursors such as triethoxysilane which yield SiH functionality to the film. Tetrakis(methoxyethoxyethoxy)silane, tetrakis(ethoxyethoxy)silane, tetrakis(butoxyethoxyethoxy) silane, tetrakis(2-ethylthoxy)silane, tetrakis (methoxyethoxy)silane, and tetrakis(methoxypropoxy) silane are particularly useful for the invention.

In a still further embodiment of the invention, the alkoxysilane compounds described above may be replaced, in whole or in part, by compounds with acetoxy and/or halogen-based leaving groups. For example, the precursor compound may be an acetoxy (CH$_3$—CO—O—) such as an acetoxy-silane compound and/or a halogenated compound, e.g., a halogenated silane compound and/or combinations thereof. For the halogenated precursors the halogen is, e.g., Cl, Br, I and in certain aspects, will optionally include F. Preferred acetoxy-derived monomers or precursors include, e.g., tetraacetoxysilane, methyltriacetoxysilane and/or combinations thereof.

In one particular embodiment of the invention, the silicon-based precursor composition includes a monomer or polymer precursor such, for example, acetoxysilane, an ethoxysilane, methoxysilane and/or combinations thereof.

In a more particular embodiment of the invention, the silicon-based precursor composition includes a tetraacetoxysilane, a $C_1$ to about $C_6$ alkyl or aryl-triacetoxysilane and combinations thereof In particular, as exemplified below, the triacetoxysilane is a methyltriacetoxysilane.

Processes for Forming Water Condensed Nanoporous Dielectric Films

Broadly, in one embodiment of the invention the method of the invention is conducted by preparing a silicon-based precursor composition that includes a porogen that is selected to age or condense in the presence of water, without the application of an external source of heat. A desired substrate is coated with the silicon-based precursor by any standard, art-known method, to form a film. The applied film is then aged or condensed in the presence of water, without the application of any external heat. The aged film is then heated at a temperature and for a duration effective to remove substantially all of the porogen, to provide a silica dielectric film having a nanometer scale pore structure, with the desired low range of dielectric constant.

In the absence of water these reactions will not occur. The precursor compositions of this invention will be very stable over time, until water is added, because polymer growth will not occur. While certain embodiments of the invention use a precursor comprising water, in many production situations it is preferred that the precursor be prepared without water to avoid the aging and thickening of the precursor between the time of mixing and the time of application to a substrate. A thicker, more viscous precursor results in thicker applied films. To avoid this potential problem, one option is to add the water to the precursor formulation just prior to application to the substrate. Avoiding the potential problems of precursor viscosity increasing over time is is a very important benefit of having the precursor aged or condensed by environmental water vapor after coating, e.g., during the manufacture of semiconductor devices.

In overview, the precursor is deposited on the substrate at room temperature (15–25° C.), usually by spin coating. Once the precursor composition is deposited onto the substrate, the resulting film will absorb water from the environment (typically chip manufacturing clean rooms have relative humidity >30%, typically about 40%). This water vapor is sufficient to age the film in situ. Optionally, the film may be heated at 25–200° C. to hasten the solidification of the film.

Once the film has aged, i.e., once it is is sufficiently condensed to be solid or substantially solid, the porogen can be removed. The latter should be sufficiently non-volatile so that it does not evaporate from the film before the film solidifies. Generally, the porogen is removed by heating the film at or above 200° C.

The precursor composition preferrably contains an acid catalyst, either volatile or nonvolatile, depending on processing requirements. Acid catalysts include, e.g., organic acids, such as glacial acetic acid; and inorganic acids such as nitric acid and hydrogen chloride; this catalyst will accelerate the hydrolysis and condensation reactions. A base catalyst (such as amine compounds) may also be added to the precursor composition for this purpose. Of particular value is the in-situ generation of catalyst by reaction of water with the monomer or polymer contained in the precursor composition. For example, reaction of water with tetraacetoxysilane produces acetic acid.

A film is judged to be porous if its refractive index (n) is less than 1.44. A non-porous film made from the liquid precursor of this invention will have a refractive index of 1.44. Air has a refractive index of 1.0. The porosity of a film is the % of its volume that is air. The porosity of a film is inversely proportional to n-1. For example, a film with n=1.27 will have porosity=100*[(1.44−1)−(1.27−1)]/(1.44−1) =39%.

Selection of a Porogen or Porogens

A porogen may be a compound or oligomer or polymer and is selected so that, when it is removed, e.g., by the application of heat, a silica dielectric film is produced that has a nanometer scale porous structure. The scale of the pores produced by porogen removal is proportional to the effective steric diameters of the selected porogen component (as noted supra, the use of a singular term encompasses the plural as well). The need for any particular pore size range (i.e., diameter) is defined by the scale of the semiconductor device in which the film is employed. Thus, for microelectronic applications in which the minimum feature size is less than 100 nm, a pore size of 10 nm or less is required. Furthermore, the porogen should not be so small as to result in the collapse of the produced pores, e.g., by capillary action within such a small diameter structure, resulting in the formation of a non-porous (dense) film. Further still, there should be minimal variation in diameters of all pores in the pore population of a given film.

Given the above, it is preferred that porogen is a compound that has a substantially homogeneous molecular weight and molecular dimension, and not a statistical distribution or range of molecular weights, and/or molecular dimensions, in a given sample. The avoidance of any significant variance in the molecular weight distribution allows for a substantially uniform distribution of pore diameters in the film treated by the invetive processes. If the produced film has a wide distribution of pore sizes, the likelihood is increased of forming one or more large pores, i.e., bubbles, on a dimensional scale of 10 nm or greater, that could interfere with the production of reliable semiconductor devices having a minimum feature size of less than 100 nm.

Preferably, the porogen has reactive groups, such as hydroxyl or amino. The reactive groups will react with the silicon precursor to form Si—O—R or Si—NHR bonds (R represents an independently selected organic moiety, e.g., an aryl or alkyl group, substituted or unsubstituted). These bonds will minimize the chance of phase separation between silicon monomer and porogen during film deposition (spin coating); minimal phase separation will lead to the best possible film appearance and thickness uniformity, and also minimize the pore size and distribution in the final film. Optionaly the porogen may have more than one reactive group of the same or different function (e.g., one or more of —OH and/or (—NH$_2$, etc.). Simply by way of example, such groups are believed to form a covalent linkage between a porogen and the Si component of the resulting film in the form of Si—O—C or Si—N—C linkages.

Furthermore, the porogen should have a molecular weight and structure such that it is readily and selectively removed from the film without interfering with film formation. This is based on the nature of semiconductor devices, which typically have an upper limit to processing temperatures. Broadly, a porogen should be removable from the newly formed film at temperatures below, e.g., about 450° C. In particular embodiments, depending on the desired post film formation fabrication process and materials, the porogen is selected to be readily removed at temperatures ranging from about 300° C. to about 400° C. during a time period ranging, e.g., from about 30 seconds to about 5 minutes. For instance, the very highest limit for multi-level interconnect processing in IC fabrication is 450° C., and many IC manufacturers require the highest limit be 400° C. Further, in certain particular embodiments, the porogen is selected to be removed at a temperature of less than 300° C. The removal of the porogen may be induced by heating the film at atmospheric pressure or under a vacuum, or by exposing the film to radiation, or both.

Porogens which meet the above characteristics include those compounds and polymers which have a boiling point, sublimation temperature, and/or decomposition temperature (at atmospheric pressure) range, for example, from about 175° C. to about 450° C., or in this range, to less than about 450° C. In particular embodiments, the boiling point, sublimation temperature, and/or decomposition temperature(s) of the porogen (at atmospheric pressure) are less than about 400° C., and in even more particular embodiments are less than about 300° C. In addition, poregens suitable for use according to the invention include those having a molecular weight ranging, for example, from about 100 to about 10,000 amu, and more preferably in the range of 100–3,000 amu.

Broadly, porogens suitable for use in the processes and compositions of the invention include polymers, preferably those which contain one or more reactive groups, such as hydroxyl or amino. Advantageously, the molecular weights of selected polymers useful as porogens ranges, for example, from about 100 to about 10,000 amu. In particular embodiments, the molecular weight of the previously mentioned polymers range, from about 100 to about 3,000 amu. Within these general parameters, a suitable polymer porogen for use in the compositions and methods of the invention is, e.g., a polyalkylene oxide, a monoether of a polyalkylene oxide, an aliphatic polyester, an acrylic polymer, an acetal polymer, a poly(caprolatactone), a poly(valeractone), a poly (methyl methacrylate), a poly (vinylbutyral) and/or combinations thereof. When the porogen is a polyalkylene oxide monoether, one particular embodiment is a $C_1$ to about $C_6$ alkyl, e.g., polyethylene glycol monomethyl ether, or polypropylene glycol monomethyl ether.

Additional porogens suitable for use in the processes and compositions of the invention include organic compounds. Specific compounds useful as porogens include, for example: 1-adamantanol (CAS #768-95-6), 2-adamantanol (CAS #700-57-2), 1-adamantanamine (CAS #768-94-5), 4-(1-adamantyl)phenol (CAS #29799-07-03), 4,4'-(1,3-adamantanediyl)diphenol (CAS #37677-93-3), a-D-cellobiose octaacetate (CAS #5346-90-7), and cholesterol (CAS #57-88-5).

Without meaning to be bound by any theory or hypothesis as to how the invention might operate, it is believed that porogens that are, "readily removed from the film" undergo one or a combination of the following events: (1) physical evaporation of the porogen during the heating step, (2) degradation of the porogen into more volatile molecular fragments, (3) breaking of the bond(s) between the porogen and the Si containing component, and subsequent evaporation of the porogen from the film, or any combination of modes 1–3. The porogen is heated until a substantial proportion of the porogen is removed. More particularly, in certain embodiments, depending upon the selected porogen and film materials, at least about 75% by weight, or more, of the porogen is removed. Thus, by "substantially" is meant, simply by way of example, removing from about 50% to about 75%, or more, of the original porogen from the applied film.

A porogen or porogens are present in the liquid precursor composition, for example, in a percentage ranging from about 1 to about 40 weight percent, or more. More particularly, a porogent or porogens are present in the liquid precursor composition, e.g., in a percentage ranging from about 2 to about 20 weight percent.

Solvents for Precursor Compositions

The precusor composition optionally includes a solvent system. Reference herein to a "solvent" should be understood to encompass a single solvent, polor or nonpolar and/or a combination of compatible solvents forming a solvent system selected to solubilize the precursor monomer or pre-polymer components, together with the other required components of the precursor composition. A solvent is optionally included in the precursor composition to lower its viscosity and promote uniform coating onto a substrate by art-standard methods (e.g., spin coating, spray coating, dip coating, roller coating, and the like.)

In order to facilitate solvent removal, the solvent is one which has a relatively low boiling point relative to the boiling point of any selected porogen and the other precursor components. For example, solvents that are useful for the processes of the invention have a boiling point ranging from about 50 to about 175° C. For instance, when the solvent boiling point is 175° C., the boiling points and/or sublimation temperature of the porogen and silicon based monomer is greater than 175° C., simply to allow the solvent to evaporate from the applied film and leave the active portion of the precursor composition in place. In order to meet various safety and environmental requirements, the solvent preferably has a high flash point (generally greater than 40° C.) and relatively low levels of toxicity. A suitable solvent includes, for example, hydrocarbons, as well as solvents having the functional groups C—O—C (ethers), —CO—O (esters), —CO—(ketones), —OH (alcohols), and —CO—N—(amides), and solvents which contain a plurality of these functional groups.

Simply by way of example, and without limitation, solvents for the precursor composition include di-n-butyl ether, anisole, acetone, 3-pentanone, 2-heptanone, ethyl acetate, n-propyl acetate, n-butyl acetate, ethyl lactate, ethanol, 2-propanol, dimethyl acetamide, propylene glycol methyl ether acetate, and/or combinations thereof It is preferred that the solvent not react with the Si-based monomer or polymer component of the precursor composition. Instead it is preferred that only the porogen can react with the Si-based component. Therefore, the solvent should preferably not contain hydroxyl or amino groups.

The solvent component is preferably present in an amount of from about 10% to about 90% by weight of the overall blend. A more preferred range is from about 20% to about 75% and most preferably from about 20% to about 60%. The greater the percentage of solvent employed, the thinner is the resulting film. The greater the percentage of porogen employed, the greater is the resulting porosity Water as an Aging or Gelling Agent As noted supra, in one embodiment of the invention the composition of the silicon-based precursor composition is selected to undergo aging or gelling in the presence of water, either liquid or water vapor. Preferably, the precursor composition is applied to a desired substrate and then exposed to an ambient atmosphere that includes water vapor, e.g., at standard temperatures and standard atmospheric pressure. The higher the relative humidity of the surrounding atmosphere, the faster the aging process will occur. Preferably, the approximately 40 percent relative humidity of the processing clean room is employed, so that no special additional processing equipment or chambers are required. Of course, the relative humidity can be varied as required for particular film forming conditions, to range, e.g., from a relative humidity of about 5% to about 99%. Measured another way, for example, the desired exposure to water vapor is provided when the atmospheric partial pressure of water vapor ranges from, e.g., about 5 mm Hg to about 20 mm Hg, As will be readily appreciated, the time period for exposure of the applied film to environmental water vapor is a time that is sufficient for the film to attain sufficient condensation so that removal of the porgen is successfully accomplished. Simply by way of example, the time for exposure to environmental water vapor ranges from a minimum of about 5 to 10 seconds, up to 30 minutes or longer. Simply by way of example, the applied precursor film is exposed to environmental water vapor for a time period ranging, e.g., from about 20 seconds to about 5 minutes, or more particularly, for a time period ranging, e.g., from about 5 seconds to about 60 seconds.

Optionally, the precursor composition is prepared prior to application to a substrate to include water in a proportion suitable for initiating aging of the precursor composition, without being present in a proportion that results in the precursor composition aging or gelling before it can be applied to a desired substrate. The water in the precursor is optionally present in an amount sufficient to fully age the film without any need for further exposure to environmental water vapor, although any convenient combination of these sources of water to support the aging process is conveniently employed for particular desired film forming situations. Simply by way of example, the water is mixed into the precursor composition in a proportion ranging from.

The mole ratio of water to the Si atoms in the monomer or polymer component is preferably from about 0 to about 50. A more preferred range is from about 0.1 to about 10 and most preferably from about 0.5 to about 1.5. The acid may be present in a catalytic amount which can be readily determined by those skilled in the art. Preferably the molar ratio of acid to silane ranges from about 0 to about 10, more preferably from about 0.001 to about 1.0, and most preferably from about 0.005 to about 0.02.

Condensation Catalysts

The precursor composition preferrably contains an acid catalyst, such as glacial acetic acid; this catalyst will accelerate the hydrolysis and condensation reactions. Optionally, a base catalyst (such as an alkali, ammonia or amine compounds with a $pK_b$ ranging from less than 0 to about 9 can be added to the precursor composition for this purpose. Amines, such as primary, secondary and tertiary alkyl amines, aryl amines, alcohol amines and mixtures thereof which have a boiling point of about 200° C. or less, preferably 100° C. or less and more preferably 25° C. or less. Other amines, include, e.g., monoethanol amine, tetraethylenepentamine, 2-(aminoethylamino)ethanol, 3-aminopropyltriethoxy silane, 3-amino-1,2-propanediol, 3-(diethylamino)-1,2-propanediol, n-(2-aminoethyl)-3-aminopropyl-trimethoxy silane, 3-aminopropyl-trimethoxy silane, methylamine, dimethylamine, trimethylamine, n-butylamine, n-propylamine, tetramethyl ammonium hydroxide, piperidine and 2-methoxyethylamine.

It should also be mentioned, simply by way of example, that when the precursor comprises acetoxy silicon monomers, the water-induced hydrolysis of the acetoxy compounds liberates acetic acid. The acetic acid catalyzes the further hydrolysis, and also accelerates condensation of the silicon precursor.

Optional Curing Steps

The artisan will appreciate that specific temperature ranges for curing substrates comprising nanoporous dielectric films according to the invention will depend upon the selected materials, substrate and desired nanoscale pore structure, as is readily determined by routine manipulation of these parameters. Generally, the curing step comprises heating the previously prepared film at a temperature of at least 400° C. and for a time period ranging from about 10 to about 60 minutes, and is desirably conducted in the absence of oxygen, e.g., under an inert gas such as $N_2$, or in a vacuum. As exemplified herein, the films are cured at about 425° C. for about 30 minutes under vacuum.

The artisan will also appreciate that any number of additional art-known curing methods are optionally employed, including the application of sufficient energy to cure the film by exposure of the film to electron beam energy, ultraviolet energy, microwave energy, and the like, according to art-known methods.

EXAMPLES

The following non-limiting examples serve to illustrate the invention.

Example 1

Nanoporous Silica Dielectric Film with 550 MW PEGMME with Heat Aging

A precursor was prepared by combining, in a 100 ml roundbottom flask (containing a magnetic stirring bar), 10 g tetraacetoxysilane (United Chemical), 10 g methyltriacetoxysilane (United Chemical), and 30 g acetone (Pacific Pac). These ingredients were combined within an $N_2$-environment ($N_2$ glove bag). The flask was also connected to an $N_2$ environment to prevent environmental moisture from entering the solution (standard temperature and pressure).

After 20 minutes of stirring using the magnetic stirring bar, 1.5 g of water was added to the flask. After 3 hours of continued stirring of the water-containing solution, 6.81 g of polyethylene glycol monomethylether ("PEGMME" Aldrich; MW550 amu) was added as a porogen, and stirring continued for another 2 hrs. Thereafter, the resulting solution was filtered through a 0.2 micron filter to provide the precursor solution for the next step.

The precursor solution was then deposited onto a series of 4 inch silicon wafers, each on a spin chuck and spun at 2500 rpm for 30 seconds. The presence of water in the precursor resulted in the film coating being substantially condensed by the time that the wafer was inserted into the first oven. Insertion into the first oven, as discussed below, took place within the 10 seconds of the completion of spinning.

Each coated wafer was then transferred into a sequential series of ovens preset at specific temperatures, for one minute each. In this example, there were three ovens, and the preset oven temperatures were 80° C., 175° C., and 300° C., respectively. The PEGMME was driven off by these sequential heating steps as each wafer was moved through each of the three respective ovens.

Each wafer was cooled after receiving the three-oven stepped heat treatment, and the produced dielectric film was measured using ellipsometry to determine its thickness and refractive index. Each film-coated wafer was then further cured at 425° C. for 30 minutes under vacuum.

Results

A film is judged to be porous if its refractive index (n) is less than 1.44. A non-porous film made from the liquid precursor of this invention will have a refractive index of 1.44. In comparison, air has a refractive index of 1.0. The porosity of a nanoporous film of the invention, is therefore proportional to the percentage of its volume that is air. The porosity of a film is inversely proportional to n−1. For example, a film with n=1.27 will have porosity of: 100*[(1.44−1)−(1.27−1)]/(1.44−1)=39%.

The measurements obtained from a representative nanoporous silica dielectric film produced by the methods of this example on a wafer, are shown in Table 1, below.

TABLE 1

| Bake Thickness (Å) | Bake RI[#] | Cure Thickness (Å) | Cure RI |
|---|---|---|---|
| 6622 | 1.255 | 5902 | 1.250 |

[#]Refractive Index

Application of the above-equation indicates that the cured film produced by in the above-described method has a porosity of about 43%.

Example 2

Nanoporous Silica Dielectric Film with 550 MW PEGMME with $H_2O$ Aging

A precursor was prepared as described for Example 1, supra. The prepared precursor mixture was deposited onto a series of 4 inch silicon wafers, which were each mounted on a spin chuck. Each coated wafer was spun at 2500 rpm for 30 seconds, and the presence of water in the precursor resulted in the film coating being substantially condensed by the time that the wafer was inserted into the oven. Insertion into the oven, as discussed below, took place within the 10 seconds of the completion of spinning.

The coated wafers were each then heated for 1 or 3 minutes in a single oven, at one of the following alternative temperatures: 200° C., 225° C., 250° C., 270° C., or 300° C., to determine the optimum temperature range for porogen removal.

Each heated wafer was then cooled, and the resulting film on each wafer was measured using ellipsometry to determine its thickness and refractive index (which can be correlated to the film's porosity.) Each film was then cured at 425° C. for 30 minutes under vacuum.

Results

Measures of film thickness and refractive index for nanoporous silica dielectric films produced and heated as described above are summarized in Table 2, below.

TABLE 2

| Bake Temp. | Bake Time (min) | Bake Thickness (Å) | Bake RI[#] | Cure Thickness (Å) | Cure RI[#] |
|---|---|---|---|---|---|
| 200° C. | 1 | 9392 | 1.443 | 6619 | 1.251 |
|  | 3 | 8047 | 1.375 | N/A* | cracked |
| 225° C. | 1 | 9127 | 1.440 | 6537 | 1.258 |
|  | 3 | 7442 | 1.348 | N/A* | cracked |
| 250° C. | 1 | 7801 | 1.291 | N/A* | cracked |
|  | 3 | 7613 | 1.286 | N/A* | cracked |
| 270° C. | 1 | 7704 | 1.254 | 6730 | 1.247 |
|  | 3 | 7588 | 1.252 | 6380 | 1.261 |
| 300° C. | 1 | 7697 | 1.240 | 6405 | 1.258 |
|  | 3 | 7550 | 1.238 | 6499 | 1.258 |

[#]Refractive Index
*Cure thickness and Cure RI is not available when cured film too extensively cracked.

As can be appreciated from an inspection of the above results, the best results were obtained with a brief 1 or 3 minute oven treatment at 270° C. or greater, which both drove off the porogen and substantially cured the film. Heating at 300° C. certainly drove off most or all of the porogen. The films after a final cure step show a slightly decreased film thickness and a slightly greater RI, confirming that curing does further increased the film density. However, the changes are relatively minor, and it is expected that the cure step will be rendered unnecessary by a modest increase in the duration and temperature of the porogen removal step.

In addition, the film made using bake temperature of 270° C. and bake time of 1 minute (See Table 2, supra) was confirmed by measurements to have an average pore size of about 20 Å (2 nanometers). In contrast, films obtained by previously employed methods have average pore diameters of, e.g., 60 Å (6 nanometers). Further, the film produced by the instant example had virtually no pores larger than 100 Å (10 nanometers). The pore size distribution was obtained by the art-known method of isothermal nitrogen adsorption which is based upon the Brunauer Emmett Teller (BET) and Kelvin theories (see, e.g., Ralph K. Iler, 1979, *Chemistry of Silica*, John Wiley and Sons, PP467 and 488–502, the disclosure of which is incorporated by reference herein). This measurement data confirms that films having nanometer scale pore structure can be produced by the method of this invention.

Example 3

Nanoporous Silica Dielectric Film with 550 MW PPGMBE with Heat Aging

A precursor was prepared as described for Example 1, supra, but a different porogen, polypropylene glycol monobutyl ether (PPGMBE; mw 340 amu), was employed. The prepared precursor was then deposited onto 4 inch silicon wafers, each on a spin chuck. Each wafer was spun at 2500 rpm for 30 seconds. The presence of water in the precursor resulted in the film coating being substantially condensed by the time that the wafer was inserted into the oven. Insertion into first oven, as discussed below, took place within the 10 seconds of the completion of spinning.

As for Example 1, supra, each coated wafer was then transferred into a sequential series of ovens preset at specific temperatures, for one minute each as preset temperatures of 80° C., 175° C., and 300° C., respectively. Each wafer was cooled after receiving the three-oven stepped heat treatment, and the produced dielectric film measured using ellipsometry to determine its thickness and refractive index. Each film-coated wafer was then further cured at 425° C. for 30 minutes under vacuum.

| Bake Thickness (Å) | Bake RI | Cure Thickness (Å) | Cure RI |
|---|---|---|---|
| 8168 | 1.277 | 7064 | 1.251 |

The above results confirm that films can be made with a second porogen.

Example 4

Nanoporous Silica Dielectric Film with 340 MW PPGMBE with $H_2O$ Aging

Precursor was made as described above for Example 3, supra. The resulting films were measured and the data summarized in the following table.

| Bake Temp. | Bake Time (min) | Bake Thickness (Å) | Bake RI | Cure Thickness (Å) | Cure RI |
|---|---|---|---|---|---|
| 200° C. | 1 | 6312 | 1.374 | 4881 | 1.269 |
| | 3 | 6187 | 1.374 | 4676 | 1.272 |
| 250° C. | 1 | 6593 | 1.322 | 4911 | 1.279 |
| | 3 | 5844 | 1.306 | 4847 | 1.273 |
| 270° C. | 1 | 6253 | 1.279 | 4982 | 1.283 |
| | 3 | 6042 | 1.285 | 5099 | 1.285 |
| 300° C. | 1 | 6557 | 1.270 | 5076 | 1.278 |
| | 3 | 6199 | 1.269 | 5228 | 1.279 |

Example 5

Control Experiment—Water added

Precursor was made as described for Example 1, supra. The mixture was deposited onto a 4 inch silicon wafer on a spin chuck. It was spun at 2500 rpm for 30 seconds. The film was heated for 1 minute in ovens at 80° C., 175° C., and 300° C. The wafer was then cooled and the film measured using ellipsometry to determine its thickness and refractive index (which can be correlated to the film's porosity.) The film was then cured at 425° C. for 30 minutes under nitrogen.

The cohesive strength was measured by the "stud pull method" which is described, for example, in co-owned U.S. Ser. No. 09/111,084, filed Jul. 7, 1998, incorporated by reference herein in its entirety.

| Cure Thickness (Å) | Cure RI | k[1] | Cohesive Strength (kpsi) |
|---|---|---|---|
| 4572 | 1.2468 | 2.3 | 7.5 |

[1]Dielectric constant.

Example 6

No Water Added

Precursor was made by mixing 10 g tetraactoxysilane (United Chemical), 10 g methyltriacetoxysilane (United Chemical), 30 g acetone (Pacific Pac), and 1.5 ml of dried glacial acetic acid (Aldrich) in a dry bag. After 3 hours of mixing, 6.81 g of 550 MW polyethyleneglycol monomethylether (Aldrich) was added as a porogen. This was then mixed for 2 hrs and then filtered with 0.2 micron filter.

The processing facility is one in which the relative humidity of the air is maintained at about 40% relative humidity.

The mixture was deposited onto a 4 inch silicon wafer on a spin chuck. It was spun at 2500 rpm for 30 seconds. Sufficient moisture was absorbed into the applied precursor during processing to substantially age or condense the applied film. The time between the end of spinning and oven insertion was, as described previously, about 10 seconds.

The film was heated for 1 minute in ovens @ 80° C., 175° C., and 300° C. The wafer was then cooled and the film was measured using ellipsometry to determine its thickness and refractive index (which can be correlated to the film's porosity.) The film was then cured at 425° C. for 30 minutes with nitrogen.

| Cure Thickness (Å) | Cure RI | k | Cohesive Strength (kpsi) |
|---|---|---|---|
| 5240 | 1.215 | 1.99 | 5.5 |

The above results confirm that water induced aging or condensation was achieved simply by absorption of water vapor from environmental air, in an environmentally controlled processing facility.

DISCUSSION

Comparative examples 5 and 6, described supra, confirm that the water-aged film has substantial cohesive strength relative to film aged without water. The cohesive strength measurement obtained above, e.g., Example 5, confirm that the nanoporous dielectric silica films produced by the methods of the present invention are substantially stronger than those obtained by application of previous methods, while retaining similar dielectric constant values.

What is claimed is:

1. A method of producing a nanoporous silica dielectric film by a process comprising
    (a) preparing a silicon-based, precursor composition comprising a porogen, and which composition comprises a component which generates a catalyst upon reaction with water;
    (b) coating a substrate with the silicon-based precursor to form a film,
    (c) aging or condensing the film in the presence of water to produce a gelled film,
    (d) heating the gelled film at a temperature and for a duration effective to remove
    substantially all of said porogen, and
    wherein said precursor composition is substantially aged or condensed in the presence of water in liquid or vapor form, without exposure to external catalyst.

2. The method of claim 1 wherein the silicon-based precursor composition comprises water in a molar ratio of water to Si ranging from about 2:1 to about 0:1.

3. The method of claim 1 wherein all of the water of step (c) is absorbed from atmospheric water vapor.

4. The method of claim 1 further comprising a curing step conducted at a temperature and for a duration sufficient to render the thickness and density of the produced film stable for use in a semiconductor device.

5. The method of claim 1 wherein the porogen has a boiling point, sublimation point or decomposition temperature ranging from about 175° C. to about 450° C.

6. The method of claim 1 wherein heating step (d) comprises heating the film at a temperature ranging from about 175° C. to about 300° C., for a time period ranging from about 30 seconds to about 5 minutes, to remove substantially all porogen.

7. The method of claim 1 wherein the porogen is selected to covalently bond to a silicon component of the precursor composition, and remains covalently bonded thereto, until the heating of step (d).

8. The method of claim 1 wherein the porogen comprises a reagent comprising at least one reactive hydroxyl or amino functional group, and said reagent is selected from the group consisting of an organic compound, an organic polymer, an inorganic polymer and combinations thereof.

9. The method of claim 1 wherein the porogen is a compound selected from the group consisting of 1-adamantanol, 2-adamantanol, 1-adamantanamine, 4-(1-adamantyl)phenol, 4,4'-(1,3-adamantanediyl)diphenol, a-D-cellobiose octaacetate, and cholesterol.

10. The method of claim 1 wherein the porogen is present in the composition in a ratio ranging from about 2 to about 20 weight percent.

11. The method of claim 1 further comprising the subsequent step of curing the film by exposure of the film to sufficient heat, electron beam energy, ultraviolet energy, or microwave energy.

12. The method of claim 1 wherein the silicon-based, precursor composition comprises a component which generates an acid catalyst upon reaction with water.

13. The method of claim 1 wherein the aging or condensing of the film is conducted without the application of heat.

14. The method of claim 1 wherein the aging or condensing of the film is conducted with by the application of heat at 25° C. to 200° C.

15. The method of claim 1 wherein the porogen has a molecular weight ranging from about 100 to about 10,000 amu.

16. The method of claim 1 wherein the silicon-based precursor composition comprises a monomer or prepolymer of Formula I:

$$R_x\text{—Si—}L_y \quad \text{(Formula I)}$$

wherein
x is an integer ranging from 0 to about 2, and y is an integer ranging from about 2 to about 4;
R is independently selected from the group consisting of alkyl, aryl, hydrogen and combinations thereof;
L is an electronegative moiety, independently selected from the group consisting of alkoxy, carboxy, amino, amido, halide, isocyanato and combinations thereof.

17. The method of claim 1 wherein at least a portion of the water of step (c) is absorbed from atmospheric water vapor.

18. The method of claim 1 wherein the porogen is selected from the group consisting of a polyalkylene oxide, a monoether of a polyalkylene oxide, an aliphatic polyester, an acrylic polymer, an acetal polymer, a poly(caprolatactone), a poly(valeractone), a poly(methyl methacrylate), a poly(vinylbutyral) and combinations thereof.

19. The method of claim 1 wherein the silicon-based, precursor composition further comprises a solvent.

20. The method of claim 15 wherein the porogen has a molecular weight ranging from about 100 to about 3,000 amu.

21. The method of claim 16 wherein the silicon-based precursor composition further comprises a polymer formed by condensing a monomer or prepolymer according to Formula I, wherein the number average molecular weight of said polymer ranges from about 150 to about 10,000 amu.

22. The method of claim 16 wherein the silicon-based precursor composition comprises a monomer or precursor that is selected from the group consisting of tetrakis(2,2,2-trifluoroethoxy)silane, tetrakis(trifluoroacetoxy)silane, tetraisocyanatosilane, tris(2,2,2-trifluoroethoxy)methylsilane, tris(trifluoroacetoxy)methylsilane, methyltriisocyanatosilane and combinations thereof.

23. The method of claim 16 wherein the silicon-based precursor composition comprises a monomer or precursor that is selected from the group consisting of an acetoxysilane, an ethoxysilane, a methoxysilane, and combinations thereof.

24. The method of claim 17 wherein the atmospheric partial pressure of water vapor ranges from about 5 mm Hg to about 20 mm Hg.

25. The method of claim 17 wherein the film is exposed to atmospheric water vapor for a time period effective for aging the applied film.

26. The method of claim 23 wherein the film is exposed to atmospheric water vapor for a time period ranging from about 20 seconds to about 5 minutes.

27. The method of claim 23 wherein the silicon-based precursor composition comprises a monomer or precursor that is selected from the group consisting of tetraacetoxysilane, a $C_1$ to about $C_6$ alkyl or aryl-triacetoxysilane, and combinations thereof.

28. The method of claim 27 wherein said triacetoxysilane is methyltriacetoxysilane.

29. The method of claim 18 wherein the polyalkylene oxide monoether comprises a $C_1$ to about $C_6$ alkyl chain between oxygen atoms and a C1 to about C6 alkyl ether moiety, and wherein the alkyl chain is substituted or unsubstituted.

30. The method of claim 29 wherein the polyalkylene oxide monoether is a polyethylene glycol monomethyl ether or polypropylene glycol monobutyl ether.

31. The method of claim 19 wherein the silicon-based, precursor composition comprises solvent in an amount ranging from about 10% to about 90% by weight.

32. The method of claim 19 wherein the solvent has a boiling point ranging from about 50 to about 175° C.

33. The method of claim 19 wherein the solvent is selected from the group consisting of hydrocarbons, esters, ethers, ketones, alcohols, amides and combinations thereof.

34. The method of claim 19 wherein the solvent is not an alcohol when the silicon based monomer or precursor comprises an acetoxy-functional group.

35. The method of claim 19 wherein the solvent does not comprise hydroxyl or amino groups.

36. The method of claim 19 wherein the solvent is selected from the group consisting of di-n-butyl ether, anisole, acetone, 3-pentanone, 2-heptanone, ethyl acetate, n-propyl acetate, n-butyl acetate, 2-propanol, dimethyl acetamide, propylene glycol methyl ether acetate, and/or combinations thereof.

* * * * *